(12) United States Patent
Su

(10) Patent No.: US 6,569,735 B2
(45) Date of Patent: May 27, 2003

(54) MANUFACTURING METHOD FOR ISOLATION ON NON-VOLATILE MEMORY

(75) Inventor: Chun-Lien Su, Tainan Hsien (TW)

(73) Assignee: Macronix International Co., Ltd. (TW)

(*) Notice: Subject to any disclaimer, the term of this patent is extended or adjusted under 35 U.S.C. 154(b) by 37 days.

(21) Appl. No.: 09/812,577

(22) Filed: Mar. 20, 2001

(65) Prior Publication Data

US 2002/0137282 A1 Sep. 26, 2002

(51) Int. Cl.[7] ............................................. H01L 21/336
(52) U.S. Cl. ........................ 438/257; 438/259; 438/424; 438/593; 257/314; 257/506
(58) Field of Search ................................ 438/257, 259, 438/424, 593; 257/314, 506

(56) References Cited

U.S. PATENT DOCUMENTS

| | | | | |
|---|---|---|---|---|
| 5,022,788 A | * | 6/1991 | Baird .................... | 405/129.35 |
| 5,330,924 A | * | 7/1994 | Huang et al. ................ | 438/258 |
| 6,177,317 B1 | * | 1/2001 | Huang et al. ................ | 438/263 |
| 6,191,444 B1 | * | 2/2001 | Clampitt et al. ............ | 257/288 |
| 6,228,712 B1 | * | 5/2001 | Kawai et al. ................ | 438/257 |
| 6,236,081 B1 | * | 5/2001 | Fukumoto .................... | 257/314 |
| 6,248,631 B1 | * | 6/2001 | Huang et al. ................ | 438/254 |
| 6,387,814 B1 | * | 5/2002 | Chen ........................... | 438/700 |
| 6,482,697 B1 | * | 11/2002 | Shirai ......................... | 438/257 |

* cited by examiner

Primary Examiner—Amir Zarabian
Assistant Examiner—Jeff Vockrodt

(57) ABSTRACT

A logic/flash memory manufacturing process generates recesses used for isolation in a self-aligned silicide process, in some specific location in the substrate, to avoid short circuits. The problem caused by misaligned borderless contact is avoided. Moreover, Very Large Scale Integration (VLSI) structure integration is improved without extra mask layers.

17 Claims, 10 Drawing Sheets

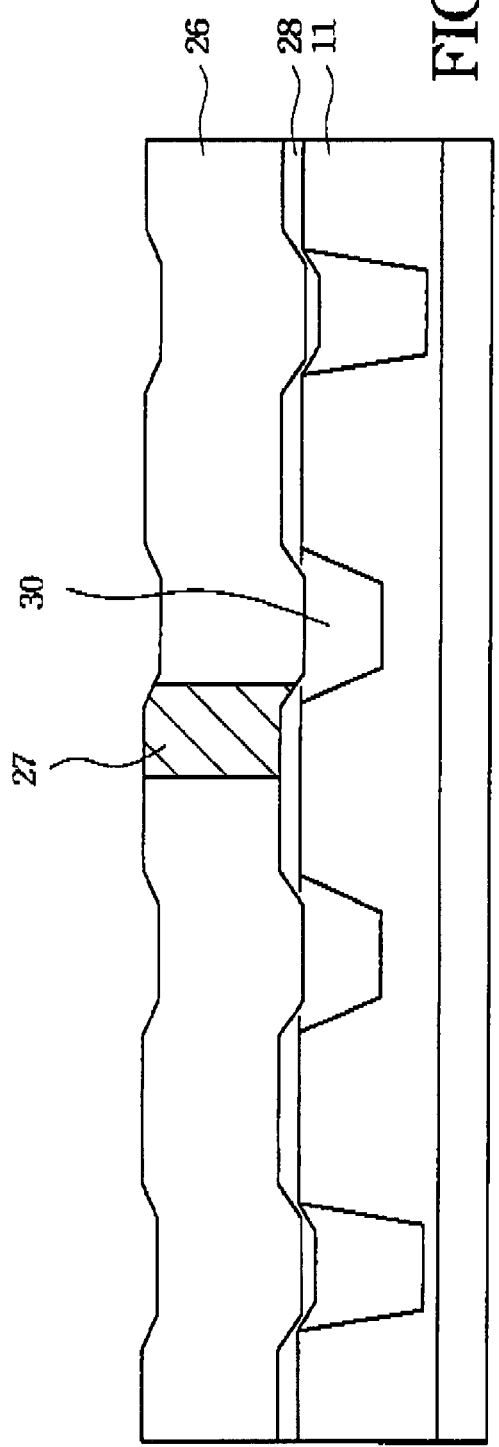
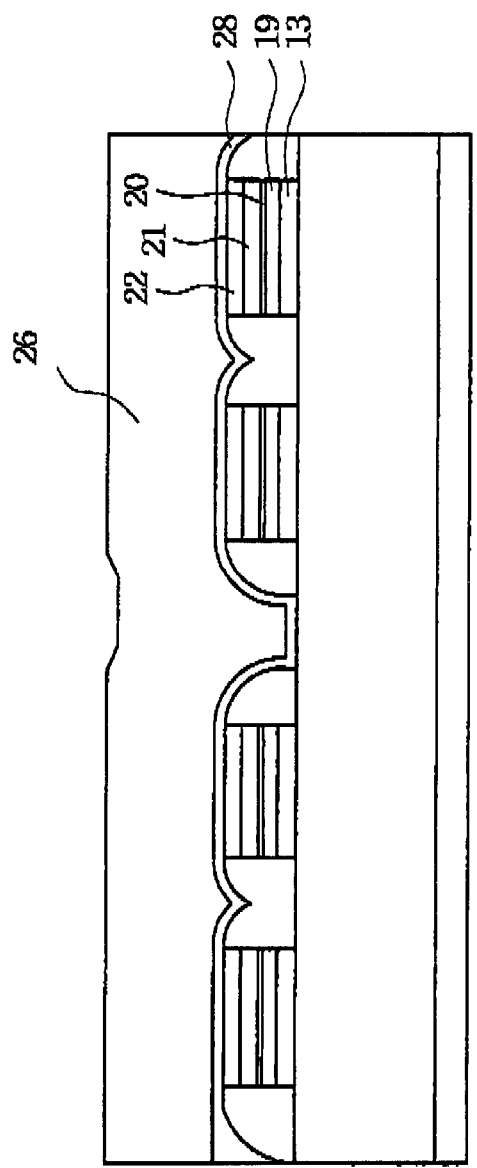

MANUFACTURING METHOD FOR ISOLATION ON NON-VOLATILE MEMORY

FIELD OF THE INVENTION

The present invention relates to semiconductor manufacturing in general, and more specifically to a method for providing an improvement of an isolation structure in a non-volatile memory.

BACKGROUND OF THE INVENTION

Non-volatile memory, which includes Mask Read-only memory (Mask ROM), Programmable Read-only memory (PROM), Erasable Programmable Read-only memory (EPROM), Electrically Erasable Programmable Read-only memory (EEPROM), and Flash memory, can keep stored information even when the electricity supply has been removed. Non-volatile memory is thus extensively used in the semiconductor industry and is another class of memories developed to prevent loss of programmed data. Typically, the manufacturer or user can program a non-volatile memory based on requirements, and the programmed data can be stored for a long time interval.

The IT market has grown quickly in the past decades. Portable computers and the electronic communications industry have become the main driving force for semiconductor VLSI design. As a result, low power consumption, high density and re-programmable non-volatile memory are in great demand. These programmable and erasable memories are able to store application programs and working systems, and they have become essential devices in the semiconductor industry.

A rising demand for memory function means higher requirements for integration level. Flash memory is advantageously multi-programmable and has become one of the fastest developing new generation memories. FIG. 1 is a schematic, top view of a conventional memory structure, which is a typical Twin Cell flame structure. A margin 6 surrounds contact 5 to prevent misalignment of contact 5. If contact 5 is misaligned and is not constructed in an anticipated position, contact 5 then falls within a region of margin 6. Margin 6 also serves as an isolation structure and thus prevents electrical shorts which would occur if contact 5 were able to conduct with nearby devices. Due to this ability to avoid a short, the entire circuit enjoys a better performance but the margin region blocks better integration in a semiconductor.

Improved integration of a semiconductor device results in a more powerful and higher performance device, and also in increased resistance in the source/drain regions. When the source/drain resistance equals the semiconductor device channel resistance, self-aligned silicide is usually used to reduce the sheet resistance of drain and source and assure complete function of a Shallow Junction between the metal and Metal-Oxide-Semiconductor (MOS) device. This is achieved by sputtering titanium on the structure surface and performing rapid thermal treatment so that the titanium and silicon react to form a good conductor. Excess titanium is removed by wet etching. Ideally, $TiSi_2$ is only formed on the surface of the drain, source and gate. In a Twin Cell frame structure as depicted in FIG. 1, neighboring $TiSi_2$ formed on a memory cell may interfere and create shorts with each other due to a lack of effective isolation therebetween. This lowers semiconductor performance.

SUMMARY OF THE INVENTION

In accordance with the preferred embodiment of the present invention, an improved non-volatile memory design resolves the problem of shorts between $TiSi_2$ when a contact is misaligned.

It is one objective of the present invention to provide a space-saving manufacturing method for non-volatile memory. The margin region employed in prior art as isolation is unnecessary because a misalignment in the present invention does not result in a short. Reduction of the margin region also advantageously increases semiconductor device integration.

It is another objective of the present invention to provide a fabrication method in which short circuits between the gate, drain and source, and different transistors are prevented.

It is yet another objective of the present invention to provide a method in which no extra mask is needed and extra procedures and cost are avoided. In accordance with the foregoing and other objectives of the present invention, a manufacturing method for novel isolation in non-volatile memory is described. The method comprises providing a substrate with a plurality of Shallow Trench Isolation (STI) structures used for defining at least a local interconnected region and an active area. A tunnel oxide is then formed on the substrate and a first polysilicon layer and a first silicon nitride layer are sequentially deposited thereon. After locating the active area of the MOS, a Buried Drain and a Large Angle Tile Drain are formed in the substrate by ion implantation. A High-Density Plasma (HDP) oxide layer is then deposited on the substrate and partially removed to expose an upper edge of the first silicon nitride layer. A second silicon nitride layer is deposited on the HDP oxide layer. Portions of the second silicon nitride layer over the first silicon nitride layer are removed by CMP. The remaining second silicon nitride layer is removed by etching. Portions of HDP oxide layer on the first silicon nitride layer are also removed while etching the remaining second silicon nitride layer.

A second polysilicon layer is then formed on the first polysilicon layer and HDP oxide layer. The second polysilicon layer is partially removed by etching to expose the STI structures and the HDP oxide layer between two first polysilicon layers. A dielectric material (ONO) layer, a third polysilicon layer and a hard mask layer are formed sequentially over the substrate. The hard mask is patterned in a direction almost perpendicular to that of the first polysilicon layer. All exposed polysilicon material, including first, second and third polysilicon layers, and the exposed portions of the ONO layer are removed, leaving the remaining HDP oxide layer.

The exposed remaining HDP oxide layer serves as a mask while etching to form recesses in the substrate. Etching continues to remove all exposed remaining HDP oxide material on the substrate surface. A dielectric material layer is then deposited over the substrate and fills the recesses in the substrate. The dielectric material layer is then overetched to expose the substrate surface, thereby obtaining a spacer which extends from the recessed area to the hard mask layer.

After the spacer is formed, a conventional multi-layer semiconductor process, such as borderless contact or Salicide process, is subsequently performed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 9A is a schematic, cross-sectional view along line BB in FIG. 6; and

FIG. 9B is a schematic, cross-sectional view along line DD.

DETAILED DESCRIPTION OF THE PREFERRED EMBODIMENT

The invention provides a novel method of manufacturing isolation structures for semiconductor devices in an integral process. The method is compatible with the LOGIC self-aligned Silicide. The invention provides a self-aligned MOS (SAMOS) process for a logic technology to form isolation which can replace the margin surrounding a contact for preventing a short circuit when misalignment occurs.

Figure 1:
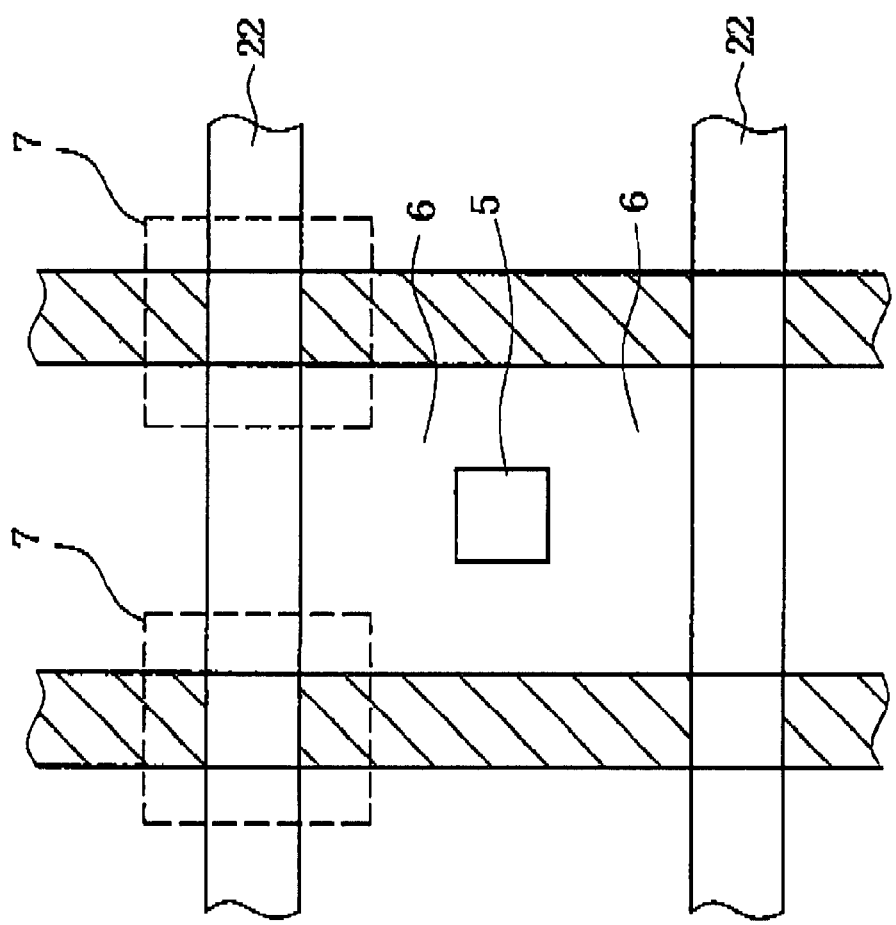
FIG. 1 is a schematic, top view of a semiconductor structure with contact location as practiced in prior art.
Figure 2:
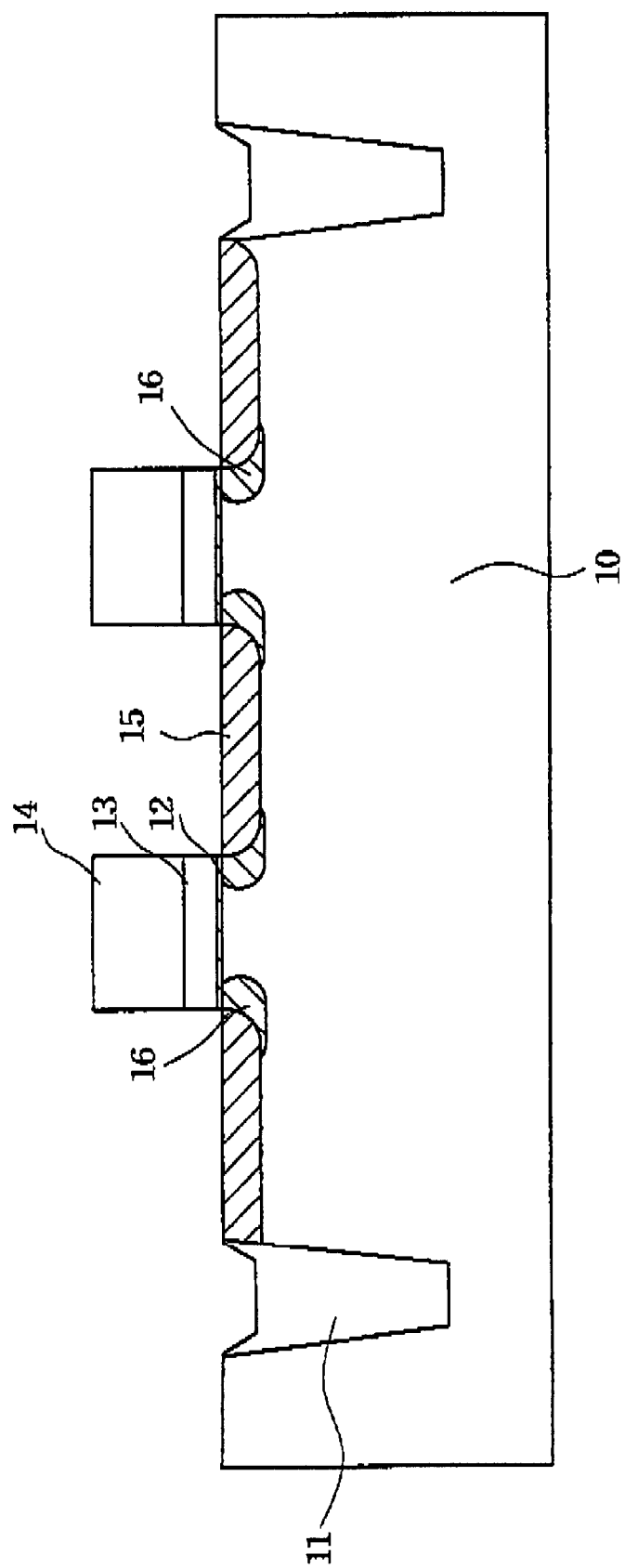
FIG. 2 is a schematic, cross-sectional view of a semiconductor structure illustrating trench formation in a substrate according to the present invention.

FIGS. 1–9 illustrate practice of the present invention in the non-volatile flash memory as the embodiment of twin-cell flash memory. Reference is made to FIG. 2, in which a single crystallized polysilicon with <100> crystallized plane semiconductor substrate 10 is isolated by a conventional process. In the preferred embodiment, an about 3500–4100 angstrom deep Shallow Trench Isolation (STI) structure 11 is formed in the substrate to avoid the disruption from different cells in the active area. A silicon nitride layer or pad oxide layer (not shown in the figure) can be used for the mask during the anisotropic etching to form trenches. Then, $SiO_2$ is deposited in the trenches and silicon nitride is removed to create the STI structures 11 between different transistors.

After this fundamental isolation structure is completed, first oxide layer 12, for example a Tunnel Oxide Layer (Tox) 12, is generated on the substrate 10 by thermal oxidation at between about 750° C. and 1000° C. to a thickness of between about 50 and 300 angstroms. After forming Tox 12, first polysilicon layer 13 is formed thereon by, for example, a conventional CVD process. The thickness of the first polysilicon layer is about 500 to 1000 angstroms. First polysilicon layer 13 is called a "floating gate" because first polysilicon layer 13 does not contact any other conductor. One of the most significant functions of polysilicon is its ability to store electric charges. Generally speaking, a higher electric charge makes a higher performance flash memory.

Then, first silicon nitride layer 14 is deposited by, for example, CVD on first polysilicon layer 13. First silicon nitride layer 14 can be used as a passivation layer because it is impenetrable. The thickness of first silicon nitride layer 14 is about 1000 to 2000 angstroms.

With reference to FIG. 2, first silicon nitride layer 14 is patterned and then used as a mask to etch first polysilicon layer 13 and Tox layer 12 until the substrate surface is exposed. After etching, the first polysilicon layer is used as a mask during an implantation to form source/drain regions. In the preferred embodiment, N++ is implanted into the substrate 10 to form Buried Drain (BD) 15 and Large Angle Tile Drain (LATID) 16 for preventing a short channel effect. The BD 15 is ion implanted with an energy of about 40 KeV to 80 KeV and a dose of about 1E15 ions/cm$^2$ to 5E15 ions/cm$^2$. LATID 16 is ion implanted with energy of about 40 KeV to 100 KeV, and dose of about 5E12 ions/cm$^2$ to 1E14 ions/cm$^2$.

Figure 3:
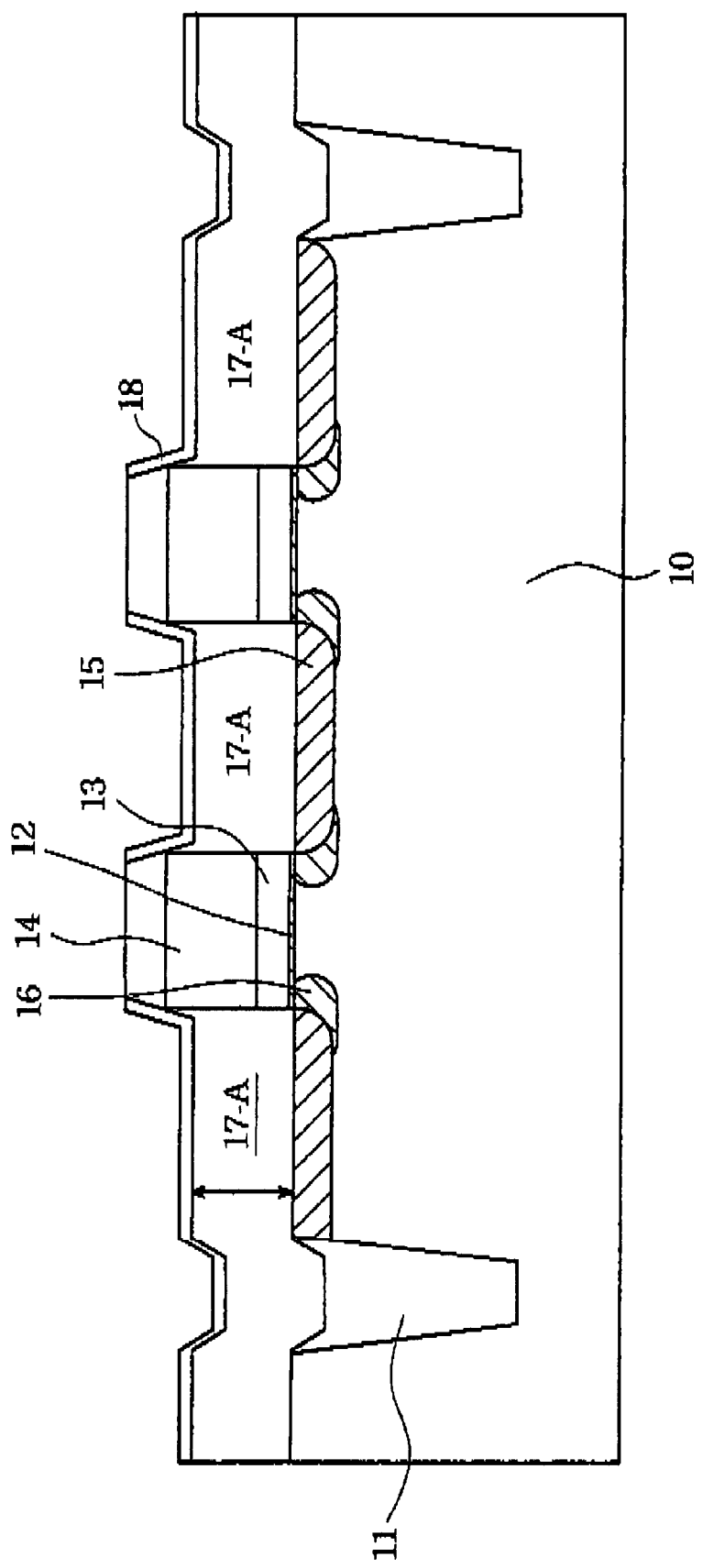
FIG. 3 is a schematic, cross-sectional view of a semiconductor structure illustrating removal of portions of the second silicon nitride layer and HDP oxide layer by CMP according to the present invention.

With reference to FIG. 3, another oxide layer (not shown) is formed over substrate 10 by, for example, HDPCVD to a thickness of about 1500 to 3500 angstroms. Then, a portion of the oxide layer is removed to leave second oxide layer 17A with a thickness of about 300 to 1550 angstroms by conventional wet etching. An upper edge of the first silicon nitride layer 14 is exposed.

Following formation of second oxide layer 17A, another silicon nitride layer (not shown) is deposited to a thickness of about 150 to 600 angstroms and then partially removed over silicon nitride layer 14 to leave a cap layer 18 in contact with the exposed edge of first silicon nitride layer 14. Removal of the silicon nitride to form cap layer 18 is performed by, for example, CMP. The removed section includes silicon nitride and a portion of second oxide layer 17A with a thickness of about 300 to 1500 angstroms. Second oxide layer 17A on BD 15 and LATID 16 is protected by first silicon nitride layer 14 and second silicon nitride 18.

Figure 4:
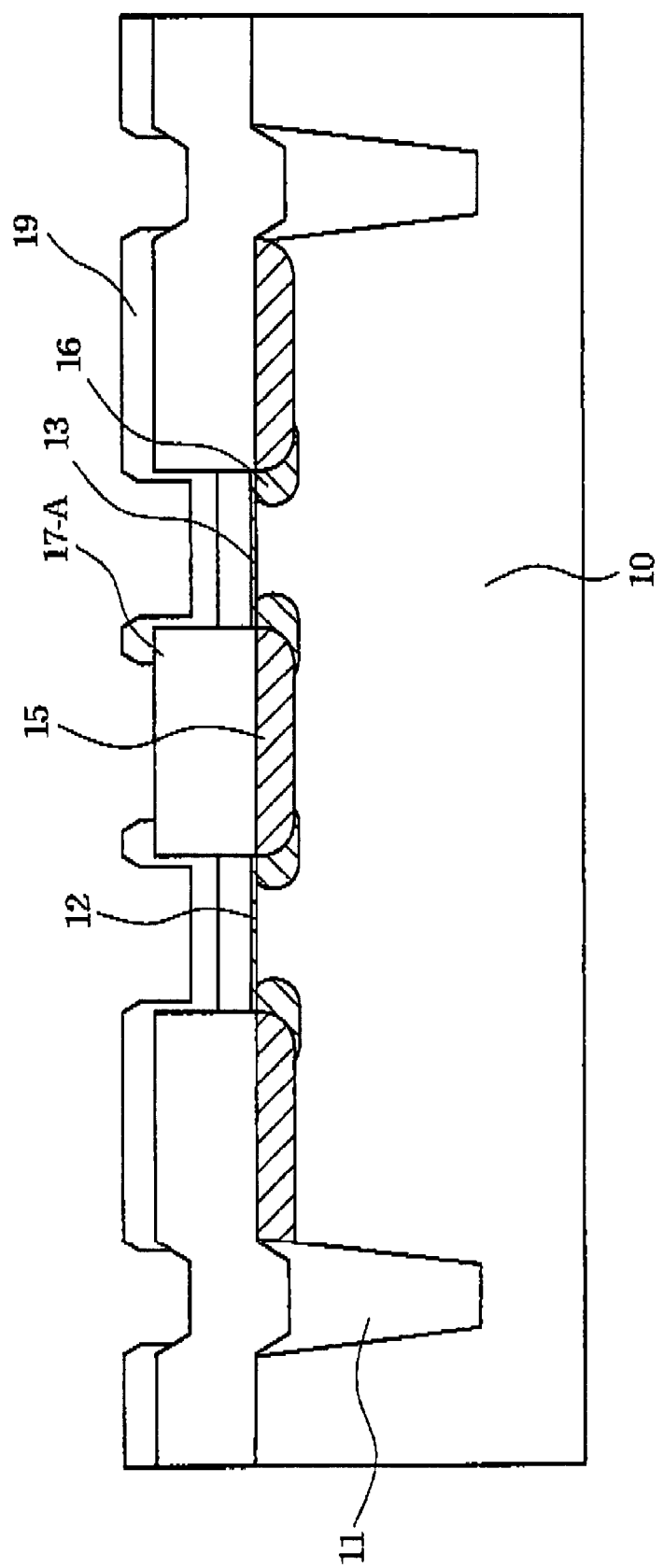
FIG. 4 is a schematic, cross-sectional view of a semiconductor structure illustrating depositing and etching the second polysilicon layer according to the present invention.

With reference to FIG. 4, after second oxide layer 17A is removed from the first silicon nitride layer 14, the first silicon nitride layer 14 and the second silicon nitride layer 18 are removed simultaneously by, for example, a dry etching process. Then, second polysilicon layer 19, for increasing the thickness of polysilicon and the electrical capacity, is deposited to a thickness of about 300 to 1000 angstroms over the remainder of first polysilicon layer 13 and HDP oxide layer 17A. t second polysilicon layer 19 is not necessary, but accommodates more electrical charge and results in a higher performance flash memory.

Figure 5A:
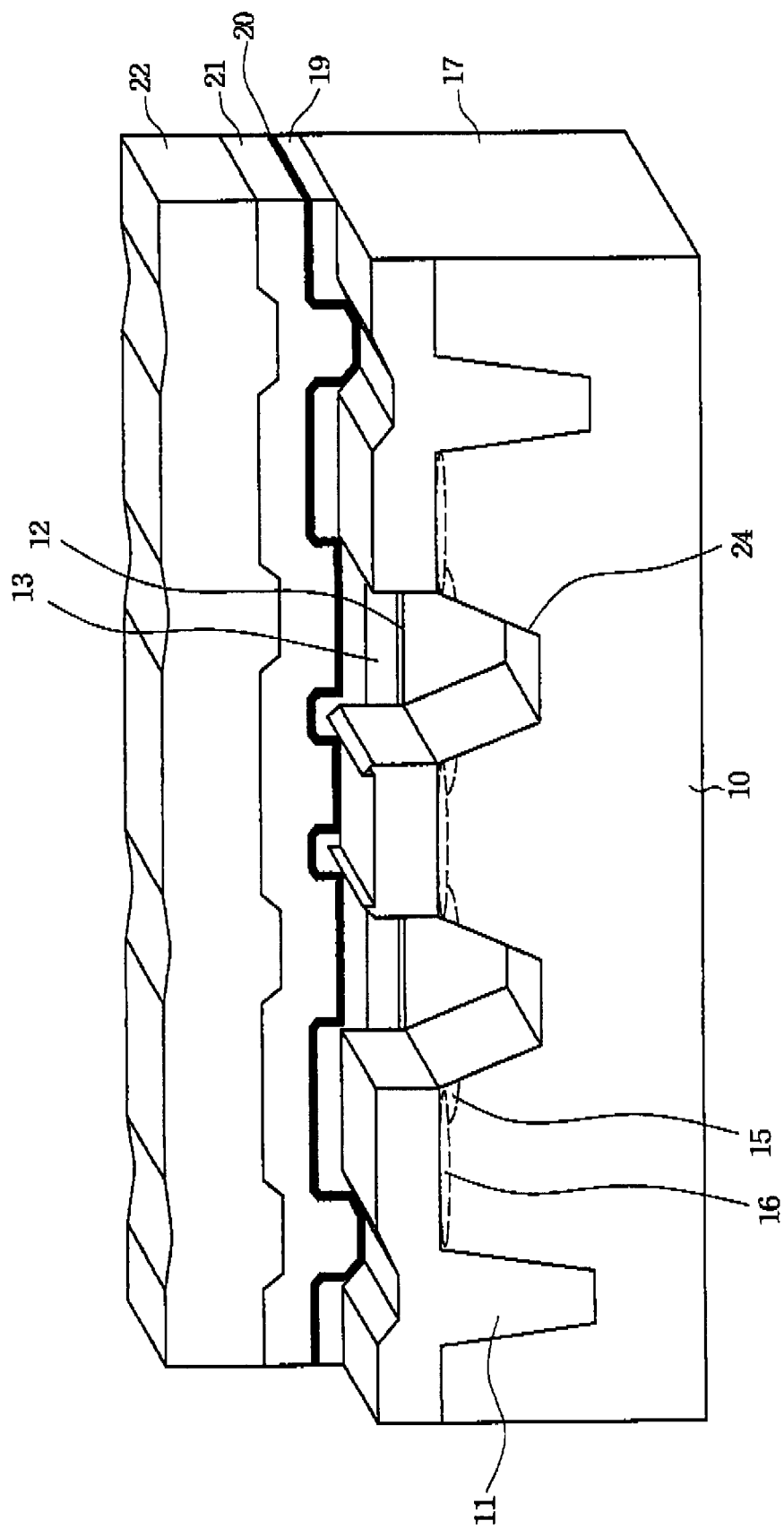
FIG. 5A is a schematic, cross-sectional view of a semiconductor structure illustrating patterning the hard mask layer in the SAMOS process, and etching the third polysilicon layer, ONO layer, the second polysilicon layer and the first polysilicon layer of the present invention.

The second polysilicon layer 19 and first polysilicon layer 13 combine to form a single polysilicon layer. The combined polysilicon is patterned and etched to remove polysilicon material on the STI structure 11 and expose a top surface of HDP oxide layer 17A. This etching step also partially removes the second polysilicon layer 19 on the HDP oxide layer 17A between two portions of the first polysilicon layer 13 as shown in FIG. 4. In FIG. 5A, a dielectric material layer 20 such as $SiO_2/Si_3N_4/SiO_2$(ONO), third polysilicon layer 21, and a hard mask layer 22, such as $WSi_2$ or oxide are deposited respectively over the substrate. An ONO layer is used for insulation and can be replaced by other materials having the same function, such as $SiN/SiO_2$. The formation of ONO can be proceeded by an ion implantation process on the surface of the combined polysilicon. In the preferred embodiment, $N_2$ and $NO_2$ can be used to control oxide growth to determine the thickness of the first oxide layer of the ONO. Furthermore, the third polysilicon layer 21 and hard mask layer 22 can be formed to a thickness of about 700 to 2000 angstroms and to a thickness of about 1000 to 30000 angstroms, respectively, by CVD. Additionally, another mask layer, such as a dielectric anti-reflection coating (DARC), can be used over the hard mask layer 22 to achieve a better effect in the following process of etching and photolithography.

After the memory structure region is defined by patterning the hard mask layer 22, the Self-Aligned Metal Oxide semiconductor (SAMOS) is formed by etching. Patterned hard mask 22 in accordance with the present invention is shown in FIG. 5A. The third polysilicon layer 21, dielectric material layer/ONO 20, the second polysilicon layer 19 and the first polysilicon layer 13 are removed respectively by dry etching until the HDP oxide layer 17A and Tox 12 on the surface of the substrate 10 are exposed.

Then, still referring to FIG. 5A, the twin cell structure is defined through the pattern of second oxide layer 17A and hard mask layer 22. Silicon material is etched with, for example $CF_4$ as the etchant through Tox 12 to form to a recess 24 with a depth of about 500 to 1500 angstroms in the substrate 10. This recess 24 is used for isolation and plays a significant role in the present invention.

Figure 5B:
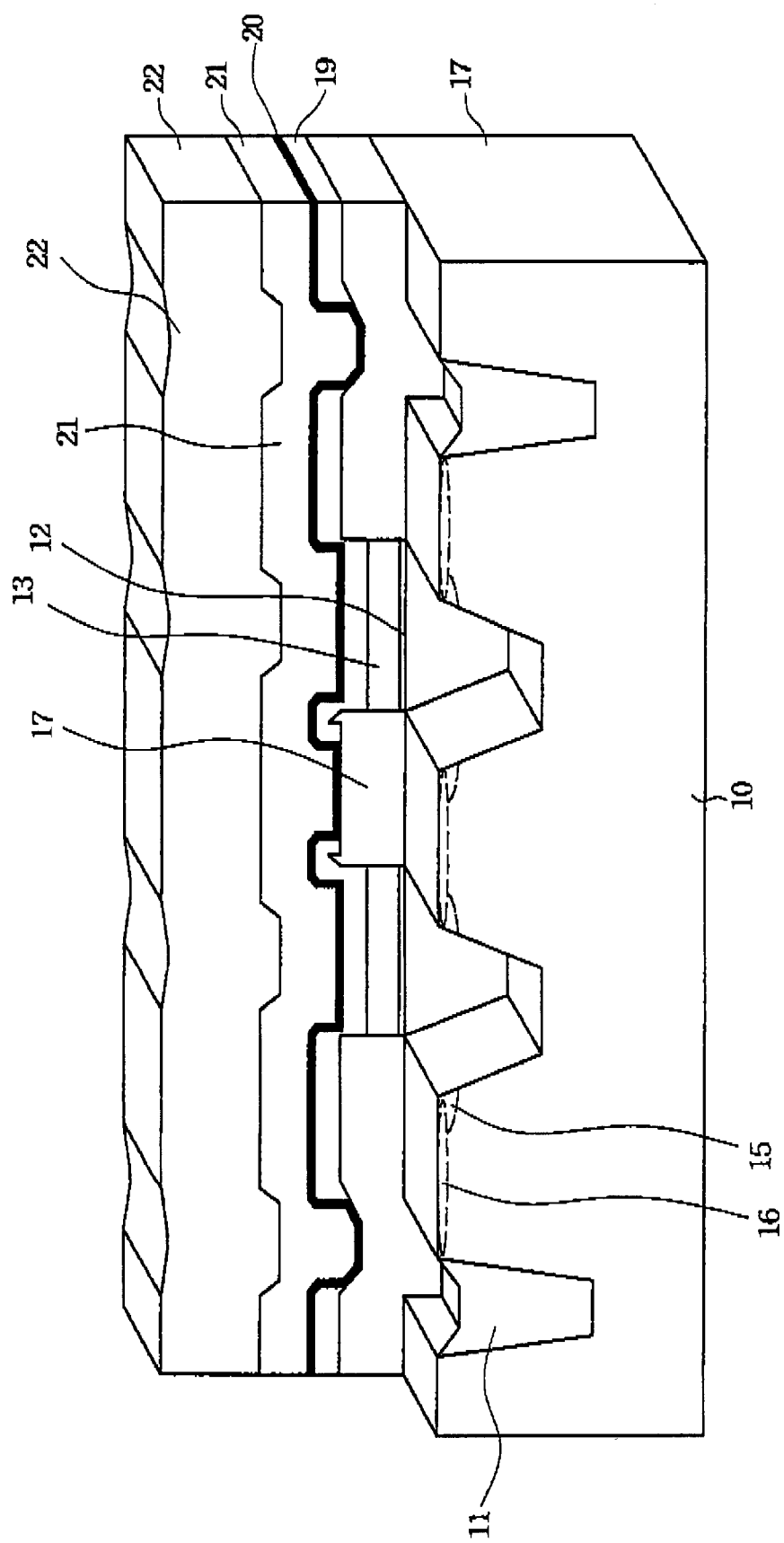
FIG. 5B is a schematic, cross-sectional view of a semiconductor structure illustrating recess formation by etching the substrate masked by HDP oxide layer according to the present invention.
Figure 6:
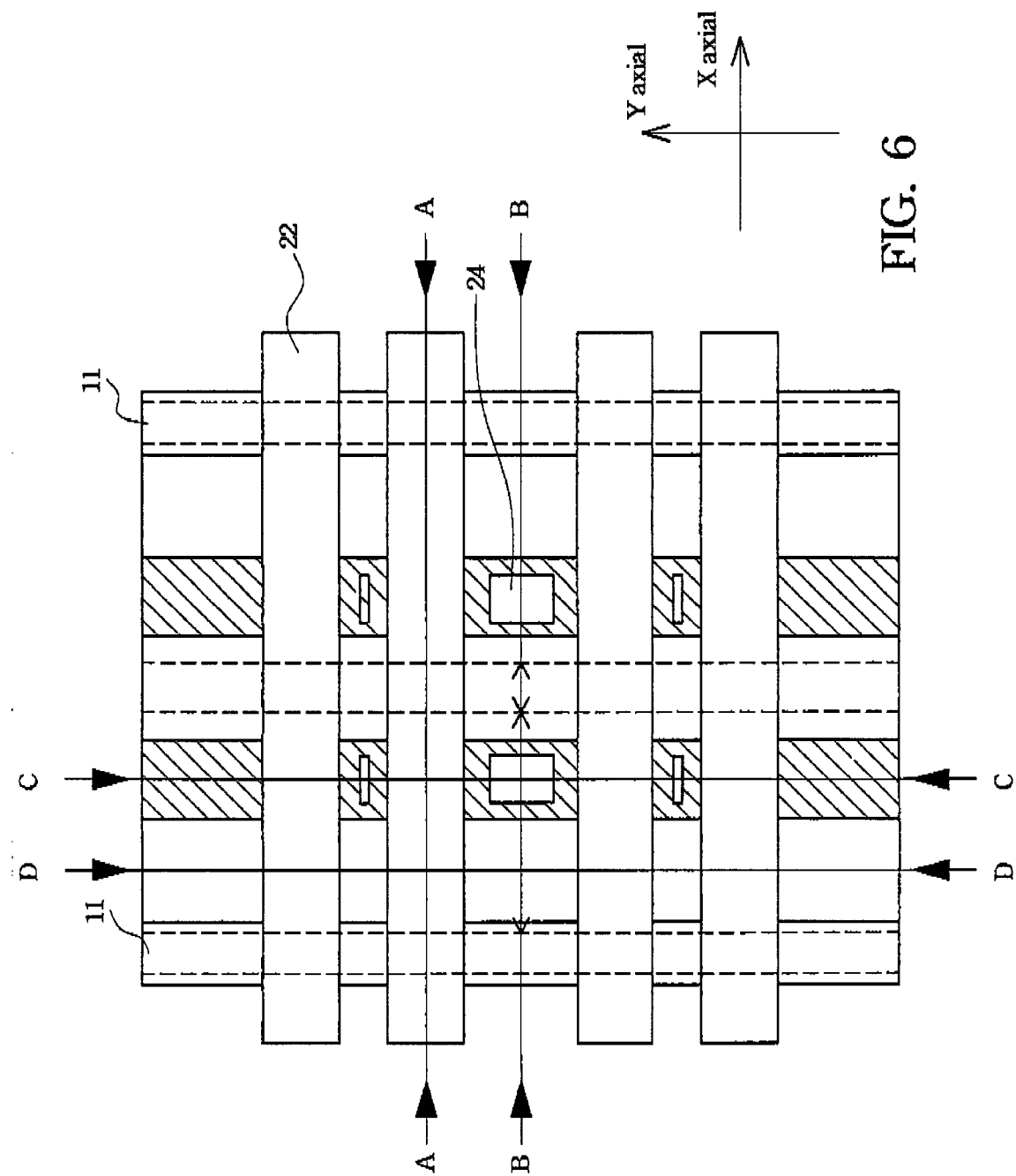
FIG. 6 is a schematic, top view of a semiconductor structure according to the present invention.
Figure 7:
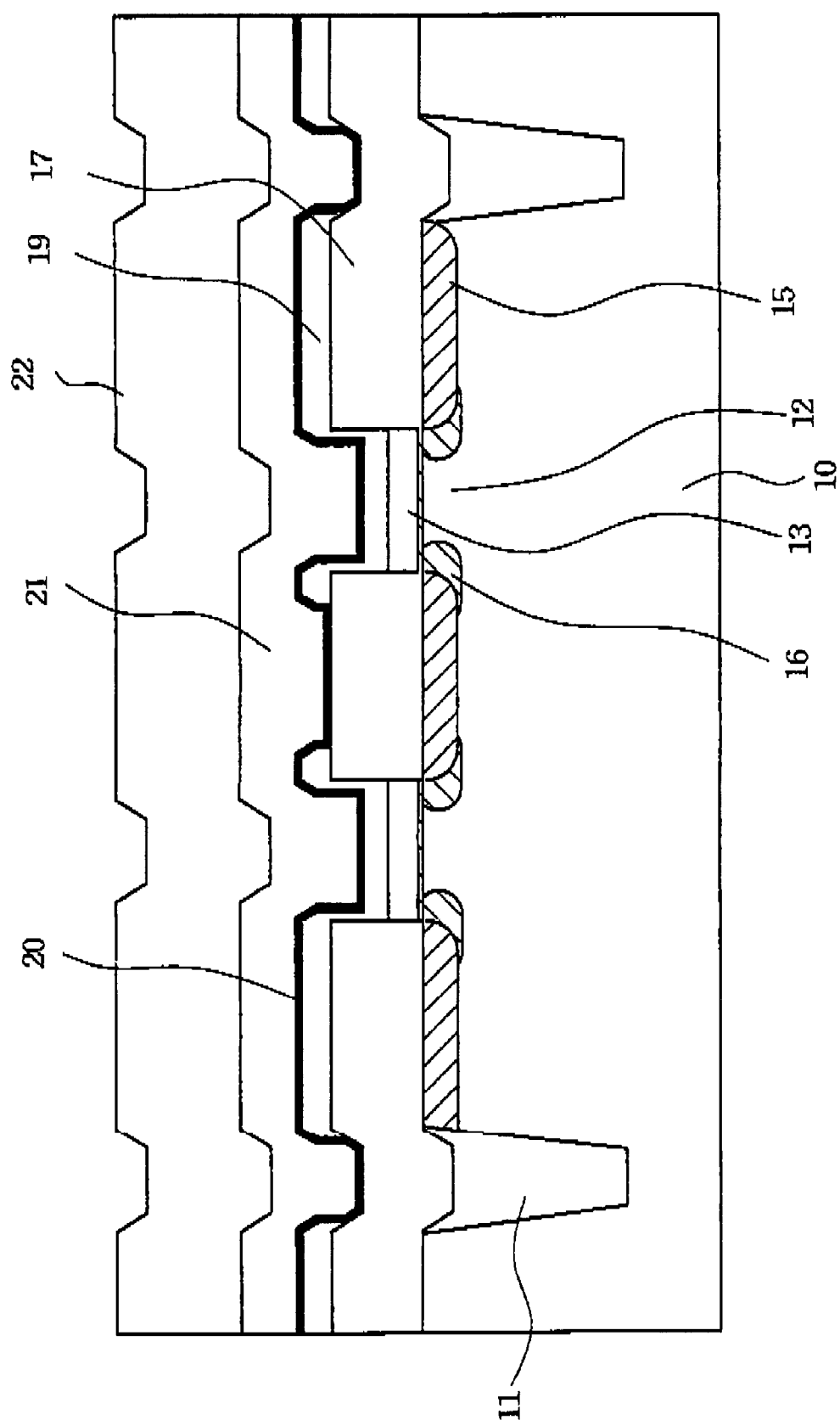
FIG. 7 is a schematic, cross-sectional view of a semiconductor structure taken along line BB of FIG. 6.
Figure 8:
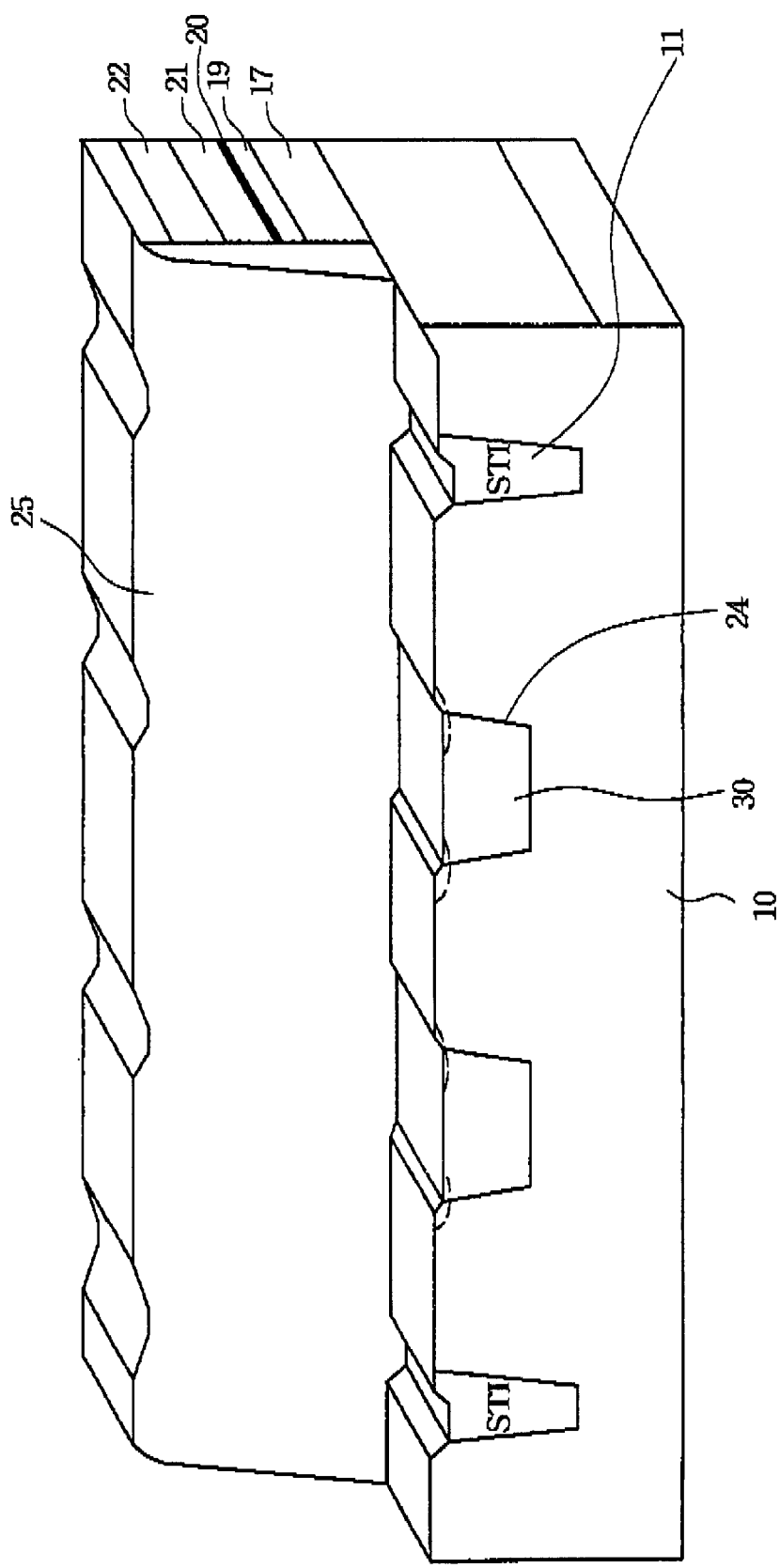
FIG. 8 is a schematic, three-dimensional view of semiconductor structure illustrating the spacer structure formed by anisotropic etching.

In the present invention, after the SAMOS etching process, exposed HDP oxide layer 17A is anisotropically dry etched while hard mask 22 serves as mask. After exposed HDP oxide layer 17A is removed, the structure shown in FIG. 5B is obtained. For further clarification, FIG. 6 is a top view of the structure. The hard mask layer 22 on line AA, as shown in FIGS. 5A and 5B, prevents the structure under the hard mask layer 22 from being etched while forming the transistor illustrated in FIG. 7. Because line BB has no hard mask 22 formed thereon, as shown in FIG. 9A, the third polysilicon layer 21, dielectric material layer/ONO 20, and the combined polysilicon layer are etched respectively. Then, with HDP oxide layer 17A serving as a mask, substrate 10 is etched to form a recess structure 24. In one of the embodiment of the present invention, after recess 24 is formed, the HDP oxide layer 17 is removed.

Subsequent to forming self-aligned recess 24 and etching HDP second oxide layer 17, spacer 25 is formed. Typically a dielectric material layer 28 is deposited to a thickness of about 3500 to 5000 angstroms by LPCVD. The deposited material not only fills recess 24, but also covers the surfaces of substrate 10, STI 11 and hard mask layer 22. Then the second dielectric material layer 28 is anisotropically etched back to form spacer 25 and the recess 24 is filled with dielectric material 28 as showed in FIG. 8.

In another embodiment of the present invention, the second oxide layer 17A (HDP) is not removed immediately after the recess 24 is formed. Spacer 25 is formed as described above, depositing a second dielectric material layer 28 first and then etching back. In the process of etching back, a portion of the second dielectric material layer 28 and residual second oxide layer 17 are removed together.

A top view of a portion of a memory cell in accordance with the present invention is shown in FIG. 6, where twin cell memory structures are formed in an active area by hard mask 22. When the present invention is used in flash memory, STI structure 11 is separates memory regions. In the present invention, the recess structure 24 when filled with dielectric material can also be used to isolate memories.

After the SAMOS process, a typical process of Self-Aligned Silicide/Salicide can be performed. For example, a metal layer (not shown), such as titanium, is formed by a conventional method and thermally treated to cause the silicon on the transistor to generate $TiSi_2$.

The formation structure between cells is shown in FIG. 9A and FIG. 9B. FIG. 9A shows a schematic, cross-sectional view taken along line BB in FIG. 6 and FIG. 9B shows a schematic, cross-sectional view taken along line DD in FIG. 6. Arrows indicate corresponding parts of FIG. 9A and FIG. 9B and demonstrate one merit of the present invention: the recess 24 for the isolation region for $TiSi_2$ in the Salicide process and prevention of shorts between cells.

With reference to FIG. 9A, in another embodiment of the present invention, the borderless contact process is performed after the MOS transistor is finished. For example, the process includes forming a thin silicon nitride 28 on the original $Si_3N_4$ 22 and forming another dielectric material (nitride or oxide) 26 thereon. Then, the dielectric material 26 is etched to form a contact window 27. During etching, because silicon nitride 28 is harder to remove than silicon oxide 26, etching stops when it hits the silicon nitride layer 28. Then another etchant is used to remove silicon nitride to form the contact window 27. The present invention replaces the conventional margin structure surrounding a contact with a recess for formation of an isolation structure. As can be seen from FIGS. 9A and 9B, a misalignment of contact window 27 will not cause a short. Furthermore, once the margin region is eliminated from the memory design rule, integration of semiconductors can be increased.

As is understood by a person skilled in the art, the foregoing preferred embodiments of the present invention are illustrated by the present invention rather than limitation of the present invention. It is intended to cover various modifications and similar arrangements, such as adding another persist mask layer over the hard mask layer 22 to prevent over-etching, included within the spirit and scope of the appended claims, the scope of which should be accorded the broadest interpretation so as to encompass all such modifications and similar structure.

What is claimed is:

1. A method for manufacturing non-volatile memory, comprising the following steps:

forming an isolation region in a semiconductor substrate;

forming a first oxide layer on the semiconductor substrate;

forming a first polysilicon layer on the first oxide layer;

forming a patterned first silicon nitride layer on the first polysilicon layer;

forming gate regions by using the patterned first silicon nitride layer as a mask to etch the first polysilicon layer and the first oxide layer;

forming sources/drains in the substrate beside the gate region by ion implantation;

forming a second oxide layer on the first silicon nitride layer and the substrate;

removing a portion of the second oxide layer to expose an upper edge of the first silicon nitride layer;

forming a second silicon nitride layer on the second oxide layer;

removing portion of the second silicon nitride layer on the first silicon nitride layer, whereby the second silicon oxide layer on the first silicon nitride layer is exposed;

removing the second oxide layer on the gate region;

removing the first silicon nitride layer and the second silicon nitride layer by etching, whereby a portion of the second oxide layer on the sources/drains is removed;

forming a second polysilicon layer on the substrate;

removing portions of the second polysilicon layer on the isolation region and the second silicon oxide layer between two gate regions;

sequentially forming a first dielectric material layer, a third polysilicon layer and a patterned hard mask layer on the second polysilicon layer and on the second oxide layer, wherein the patterned hard mask layer is in a direction almost perpendicular to that of the first polysilicon layer;

etching the third polysilicon layer, the first dielectric material layer, the second polysilicon layer and the first polysilicon layer by using the patterned hard mask layer as a mask to define a gate structure;

removing exposed first silicon oxide layer;

etching the substrate by using the patterned hard mask layer and the second silicon oxide layer as mask to form recesses;

removing exposed second silicon oxide layer;

forming a second dielectric material layer to fill the recesses and cover the substrate and the hard mask layer; and etching further the second dielectric material layer until a surface of the substrate is exposed to form a spacer on a sidewall of the gate structure.

2. The method of claim 1, wherein the first oxide layer is a tunneling oxide layer.

3. The method of claim 1, wherein the first oxide layer is formed by thermal oxidation at temperature between about 750 □ and 1000 □ to a thickness of about 50 to 300 angstroms.

4. The method of claim 1, wherein the first polysilicon layer is formed to a thickness of about 500 to 1000 angstroms.

5. The method of claim 1, wherein the first silicon nitride layer is formed to a thickness of about 1000 to 2000 angstroms.

6. The method of claim 1, wherein the sources/drains are buried drains or large angle tile drains.

7. The method of claim 5, wherein the buried drain is implanted with an energy of about 40 KeV to 80 KeV, and a dose of about 1E15 ions/cm$^2$ to 5E15 ions/cm$^2$.

8. The method of claim 5, wherein the large angle tile drain is implanted with an energy of about 40 KeV to 100 KeV, and a dose of about 5E12 ions/cm$^2$ to 1E14 ions/cm$^2$.

9. The method of claim 1, wherein the second oxide layer is a high density plasma oxide layer with a thickness of about 1500 to 3500 angstroms.

10. The method of claim 1, wherein the second silicon nitride layer is formed to a thickness of about 150 to 600 angstroms.

11. The method of claim 1, wherein a top portion of the second silicon nitride layer and the portion of the second oxide layer to expose the upper edge of the first silicon nitride layer are removed to a depth of about 300 to 1500 angstrom by CMP.

12. The method of claim 1, wherein the first silicon nitride layer and the second silicon nitride layer are removed by dry etching, whereby the portion of the second oxide layer on the sources/drains is also removed.

13. The method of claim 1, wherein the second polysilicon layer is formed to a thickness of about 300 to 1000 angstroms.

14. The method of claim 1, wherein the dielectric material layer is O/N/O or N/O.

15. The method of claim 1, wherein the third polysilicon layer is formed to a thickness of about 700 to 2000 angstroms.

16. The method of claim 1, wherein a material for the hard mask layer is selected from a group consisting of $WSi_2$, $Si_3N_4$ and oxide, and the hard mask layer has a thickness of about 700 to 30000 angstroms.

17. The method of claim 1, wherein the second dielectric material layer is formed to a thickness of about 3500 to 5000 angstroms by LPCVD.

* * * * *